United States Patent [19]

Haraguchi et al.

[11] Patent Number: 5,320,932
[45] Date of Patent: Jun. 14, 1994

[54] METHOD OF FORMING CONTACT HOLES

[75] Inventors: Hiroshi Haraguchi; Hitoshi Tsuji; Yasuhisa Yoshida, all of Kawasaki, Japan

[73] Assignee: Kabushiki Kaisha Toshiba, Kawasaki, Japan

[21] Appl. No.: 696,734

[22] Filed: May 7, 1991

[30] Foreign Application Priority Data

May 9, 1990 [JP] Japan .................................. 2-118883

[51] Int. Cl.$^5$ .......................... G03F 7/26; G03C 5/00
[52] U.S. Cl. .................................. 430/312; 430/313; 430/316; 430/317; 430/328; 430/330; 430/394; 430/396; 156/643; 156/659.1; 437/228; 437/229
[58] Field of Search ............... 430/311, 312, 313, 316, 430/317, 319, 328, 339, 394, 396; 156/643, 646, 659.1; 437/228, 229

[56] References Cited

U.S. PATENT DOCUMENTS

| | | | |
|---|---|---|---|
| 4,546,066 | 10/1985 | Field | 430/330 |
| 4,579,812 | 4/1986 | Bower | 430/316 |
| 4,814,243 | 3/1989 | Ziger | 430/330 |
| 4,997,746 | 3/1991 | Greco | 430/316 |

*Primary Examiner*—Marion E. McCamish
*Assistant Examiner*—Kathleen Duda

*Attorney, Agent, or Firm*—Finnegan, Henderson, Farabow, Garrett & Dunner

[57] ABSTRACT

In a method of forming contact holes in an interstage insulation layer having a thick portion on the semiconductor substrate in which a first contact hole leading to the substrate surface is to be formed and a thin portion on an electrode in which a second contact hole leading to the electrode is to be formed, a positive-type resist layer is formed on the interstage insulation layer. Then first and second portions of the resist layer which are aligned with the first and second contact holes to be formed are exposed to light, and thereafter the resist layer is heated, thereby making the exposed first and second portions insoluble in a developer. Thereafter, the first portion of the resist layer is exposed to light and then subjected to a developing treatment to form an opening in the first portion of the resist layer. Using the resultant resist layer as a mask, the interstage insulation layer is subjected to an etching process to etch the first portion (thick portion) thereof by a predetermined thickness so as to have substantially the same thickness as that of the second portion (thin portion) of the same. Thereafter, the second portions of the resist layer are exposed to light and then subjected to a developing treatment to form openings in the second portion of the resist layer.

7 Claims, 6 Drawing Sheets

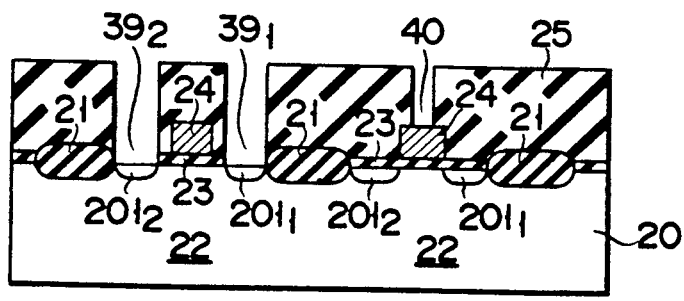
F I G. 3J
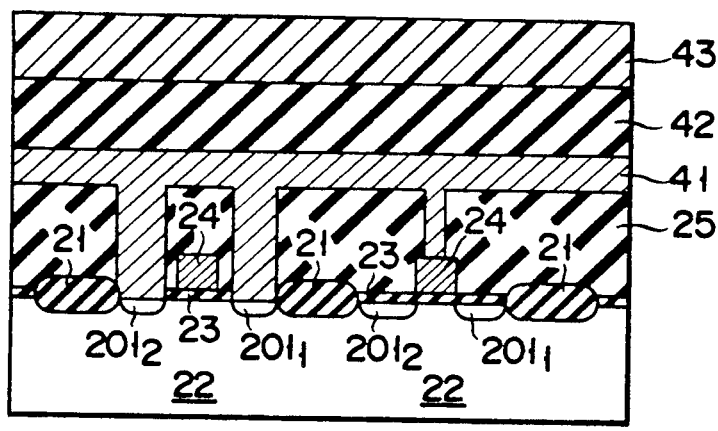
F I G. 3K

METHOD OF FORMING CONTACT HOLES

BACKGROUND OF THE INVENTION

1. Field of the Invention

This invention relates to a method of forming contact holes in a semiconductor substrate and simultaneously in an electrode formed on the substrate.

2. Description of the Related Art

In general, to produce a semiconductor element, a second conductive type impurity is implanted into a first conductive type semiconductor substrate, and then diffused in it, thereby forming impurity regions. These impurity regions serve as active regions, passive regions, and/or resistor elements In a field effect transistor, the impurity regions are used as a source region and a drain region Further, an insulation layer of a predetermined pattern is formed on the substrate, for defining an element-forming region. A thin gate oxide layer is formed on the element-forming region, a gate electrode is formed on the oxide layer, and an interstage insulation layer is formed on the resultant structure. A wiring layer is formed on the interstage insulation layer, and connected to the electrode through a contact hole formed in the interstage layer.

The upper surface of the interstage insulation layer can be leveled or flattened by etch back method developed in recent years, so that a wiring layer formed thereon has no stepped portions, thereby preventing the wiring layer from being disconnected and hence enhancing the reliability of the semiconductor element The interstage insulation layer, however, does not have a uniform thickness since it has a flat upper surface For example, that portion of the layer which extends between the upper surface of the layer and that of the substrate is thicker than that portion of the same which extends between the upper surface of the layer and that of the electrode formed above the substrate.

Now, a conventional method of forming contact holes of a field effect transistor will be explained with reference to FIG. 1A-1E. As is shown in FIG. 1A, a plurality of element-forming regions 3 are defined in a first conductive type (e.g. p-type) silicon substrate 1 by forming a selective oxide layer 2 for isolating elements on the substrate 1. The element-forming regions 3 each have a surface region in which a second conductivity type (e.g. n-type) impurity difference region as a source region $101_1$ and a second conductivity type impurity diffused region as a drain region $102_2$ are formed. Gate oxide layers 4, gate electrodes 5, and an interstage insulation layer 6 are formed on and above the element forming regions 3. The upper face of the layer 6 is leveled or flattened by etch back method, on which a positive-type resist layer 7 is formed, as is shown in FIG. 1B. A mask 8 is placed over the layer 7, and ultraviolet light 9, indicated by the arrows in FIG. 1B, is applied to the layer 7 through the mask 8 by means of an aligner (not shown). Then, the layer 7 is developed, thereby forming openings $10_1$ and $10_2$ for impurity diffused regions and an opening 11 for a gate electrode. Subsequently, as is shown in FIG. 1D, the interstage insulation layer is etched by RIE (Reactive Ion Etching) with the use of the resist layer 7 as a mask, thereby forming therein contact holes $12_1$ and $12_2$ which reach the impurity diffused regions $101_1$ and $101_2$ and a contact hole 13 which reaches the electrode 5. As can be understood from FIG. 1D, the electrode 5 is also etched to some extent. That is, it has a depression 14 (FIG. 1E). This is because that portion of the interstage insulation layer 6 which extends between the upper surface of the layer and that of the substrate is thicker than that portion of the same which extends between the upper surface of the layer and that of the electrode formed above the substrate.

As is described above, in the conventional method, over-etching occurs when contact holes are simultaneously formed in those portions of the interstage insulation layer which have different thicknesses. To avoid this, it is considered that contact holes for gate electrodes are formed by means of a lithography process different from that in which contact holes for impurity regions are formed. In this case, however, the number of the required processes is increased.

There is another method to avoid over-etching. As is shown in FIG. 2, a resist thin film 15 for preventing over-etching is formed on that portion of the resist layer 7 which is aligned with the thin portion of the interstage insulation layer 6 (in which the contact hole 13 is to be formed). In this method, however, another lithography process is required for forming the resist thin film 15, and further a mask may not be placed in a desired position when the film 15 is formed.

SUMMARY OF THE INVENTION

It is the object of the invention to form contact holes in an interstage insulation layer by means of a small number of processes without over-etching the electrode formed in the layer.

To attain the object, the present invention provides a method of forming contact holes comprising the steps of: forming an element separating insulation layer of a predetermined pattern on a surface region of a semiconductor substrate of a first conductivity type to define an element forming region in the semiconductor substrate; forming an oxide layer on said element forming region; forming an electrode on said oxide layer; forming an interstage insulation layer having a flat surface over the resultant semiconductor structure, the interstage insulation layer having a flat surface so that that portion thereof which is on said semiconductor substrate is thicker than that portion of the interstage insulation layer which is on said electrode, the interstage insulation layer having a first portion in which a first contact hole leading to said semiconductor substrate is formed at a later step and a second portion in which a second contact hole leading to said electrode is formed at a later step; forming a positive type photoresist layer over said interstage insulation layer, having a first portion corresponding to said first portion of said interstage insulation layer and a second portion corresponding to said second portion of said interstage insulation layer; exposing that portion of said photoresist layer to light rays which corresponds to a portion other than said first and second portions of said interstage insulation layer; heating said photoresist layer to make said corresponding portion of said photoresist layer to make it insoluble to a developer; exposing said first portion of said photoresist layer to light rays to make it soluble; subjecting said photoresist layer to a developer to dissolve said first portion thereof to form a first opening thereat; etching said first portion of said interstage insulation layer by a thickness using the resultant photoresist layer as a mask, to make a thickness of the resultant first portion of the interstage insulation layer substantially equal to that of said second portion of the interstage insulation layer; exposing said photoresist layer to light rays to make said second portion of the photoresist layer soluble; subjecting said photoresist layer to a developer to dissolve said second portion thereof to form a second opening thereat; and simultaneously etching said resultant first portion and second portion of said interstage insulation layer using the resultant photoresist layer as a mask to form said first and second contact holes in said interstage insulation layer.

The present invention has been made in consideration of the fact that a positive-type resist layer once exposed to light becomes insoluble in a developer when it is heated in the atmosphere of ammonia. Specifically, in the invention, a positive-type resist layer is formed on an interstage insulation layer. Then, those portions of the resist layer which are aligned with contact holes to be formed in the interstage layer are exposed to light, and thereafter the resist layer is heated, thereby making the exposed portions insoluble in a developer.

Although a usual positive-type resist layer is heated in an oven in the atmosphere of ammonia, a so-called image-reverse resist layer contains ammonia, and hence is heated without the ammonia atmosphere. In both cases, it is needed to minimize the amount of the moisture existing in the oven, so as to avoid occurrence of ammonia water.

After the resist layer is converted to be insoluble, selected portions of the resist layer are exposed to light and developed. Using the resultant resist layer as a mask, those thick portions of the interstage insulation layer in which contact holes leading to the substrate surface are to be formed are etched by a predetermined depth so as to have substantially the same thickness as the thin portion of the same in which a contact hole leading to an electrode is to be formed. Subsequently, another selected portion of the resist layer which corresponds to the above thin portion is exposed to light and developed. Using the resultant resist layer as a mask, the above-described portions of the interstage insulation layer are simultaneously etched to form the contact holes, using reactive ion etching (aeolotropic etching) or wet etching (isotropic etching). With the above method, the electrode is not subject to an over-etching.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIGS. 3A to 3K are sectional views, useful in explaining a method of forming contact holes in a semiconductor device, according to the invention.

DETAILED DESCRIPTION OF THE PREFERRED EMBODIMENTS

The present invention will be explained in detail with reference to FIGS. 3A to 3K showing an embodiment thereof. In the embodiment, the invention is applied to a field effect transistor.

Figure 3A:
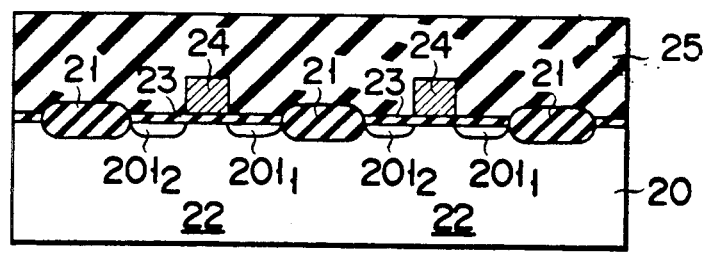

As is shown in FIG. 3A, in a surface region of a first conductive type (e.g. n-type) silicon semiconductor substrate 20, element-forming regions 22 are defined by forming an insulation layer ($SiO_2$ layer) 21 of a predetermined pattern having a thickness of 1.5–2.0 $\mu$m on the substrate by means of LOCOS (Local Oxidation of Separation). Then, the entire surface of the substrate is thermally oxidized, and, a gate oxide layer 23 is formed on the element-forming regions. Subsequently, a conductive metal (e.g. MoSi) layer is formed on the oxide layer 23 by, for example, sputtering, and then patterned, thereby forming a gate electrode 24 on the gate region. An impurity of a second conductive type (e.g. p-type) is implanted into the element-forming regions 33, and then diffused by a heat treatment, thereby forming impurity regions $201_1$ and $201_2$ used as source and drain regions, respectively. An interstage insulation layer 25 having a thickness of 1.5–2.0 $\mu$m is formed on the resultant structure. A CVD (Chemical Vapor Deposition) silicon oxide (e.g. silicon dioxide) layer, a plasma silicon oxide (e.g. silicon dioxide), or a bias silicon oxide (e.g. silicon dioxide) is used as the interstage insulation layer 25.

Figure 3B:
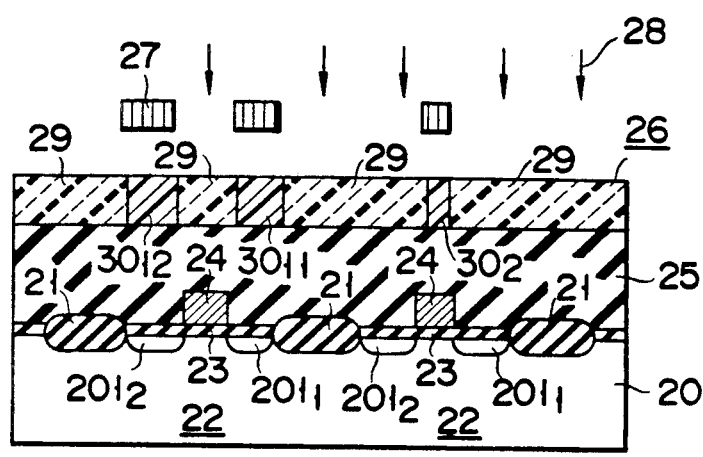

As is shown in FIG. 3B, a positive-type resist layer 26, made of e.g. NPR 820 marketed by Nagese & Co., Ltd., is formed on the layer 25.

The positive-type layer 26 is subjected to a pre-bake treatment in a conventional manner, and then ultraviolet light 28 is applied to the layer 26 through a mask 27, thereby forming exposed portions 29 and unexposed portions $30_{11}$, $30_{12}$, and $30_2$ in the layer 26. The mask 27 is positioned above the semiconductor structure such that the openings formed in the mask are aligned with contact holes to be formed in the interstage insulation layer 25. Those portions of the layer 25 which are located under the unexposed portions $30_{11}$ and $30_{12}$ reach the substrate surface, i.e., to impurity regions $201_1$ and $201_2$, whereas that portion of the layer 25 which is located under the unexposed portion $30_2$ reaches the electrode 24. That is, the first-mentioned portions of the layer 25 are thicker by the thickness of the electrode 24 than the latter portion.

Figure 3C:
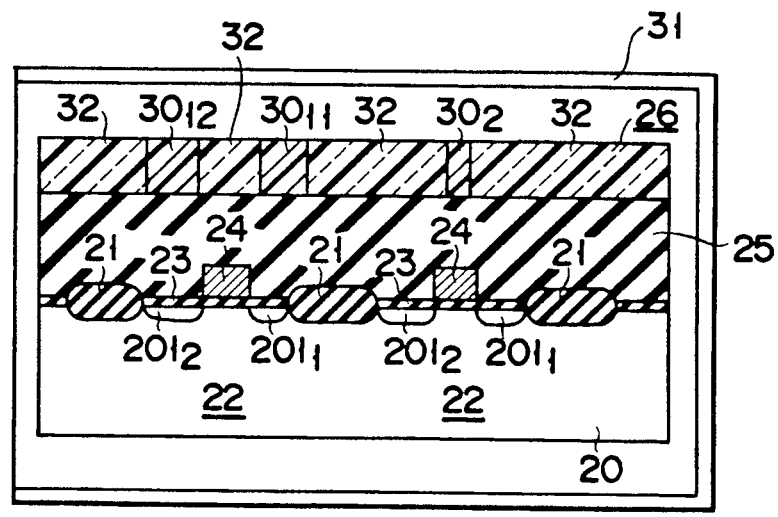

Then, as is shown in FIG. 3C, the resultant structure is subjected to a heat treatment in the atmosphere of moistureless ammonia in an oven 31, thereby converting the exposed portions 29 into portions 32 insoluble in an alkaline liquid such as a choline liquid. If an image-reverse resist such as AZ5214E, marketed by Hexist Corporation and made of an amine-based material or imidazole-based material, is used as the material of the positive-type resist layer 26, the unexposed portions 29 can be made alkali-insoluble by a heat treatment carried out in a dry atmosphere in the oven. Further, OFPR8600 marketed by Tokyo Ohka Industries Co., Ltd. may be used as the positive-type resist.

Figure 3D:
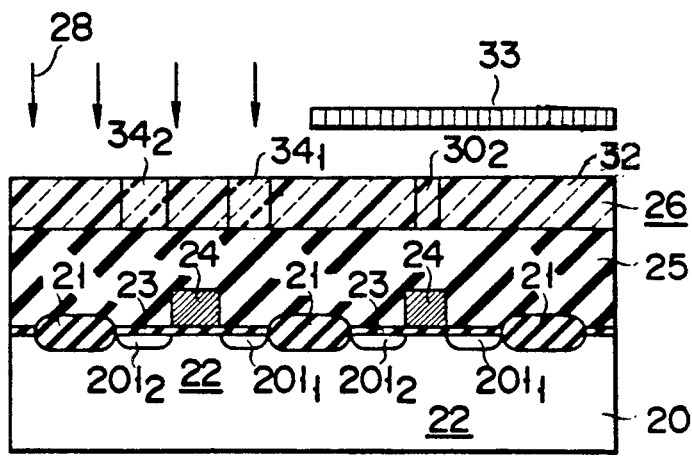

Then, as is shown in FIG. 3D, ultraviolet light 28 is applied to the layer 26 to expose the unexposed portions $30_{11}$ and $30_{12}$ which are above the thick portion of the interstage insulation layer 25, with a mask 33 covering the unexposed portion $30_2$ which is above the thin portion of the interstage insulation layer 25. Thus, the portions $30_{11}$ and $30_{12}$, in which contact holes leading to the impurity regions are to be formed, are converted into choline-soluble portions $34_1$ and $34_2$, respectively.

Figure 3E:
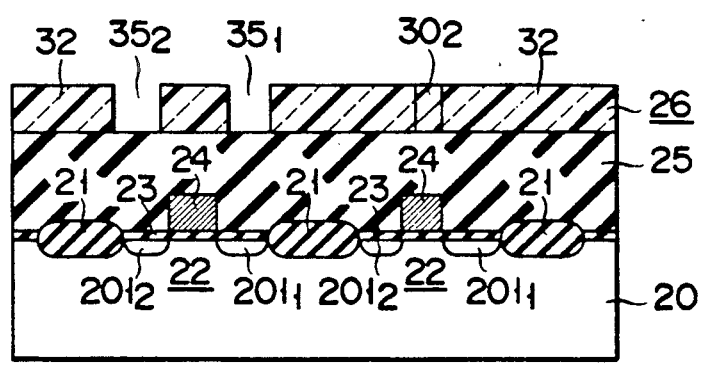

Thereafter, as is shown in FIG. 3E, openings $35_1$ and $35_2$ for providing the contact holes are formed by a developing treatment using choline solution in the portions $34_{11}$ and $34_{12}$ of the resist layer 26.

Figure 3F:
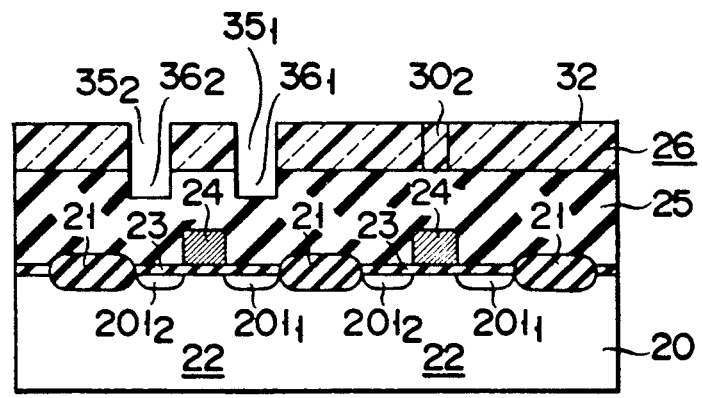

As is shown in FIG. 3F, etched portions $36_1$ and $36_2$, having a depth substantially identical to the thickness of the gate electrode 24, are formed in the interstage insulation layer 25 by etching, thereby making the thicknesses of those portions of the layer 25 which are aligned with the openings $35_1$ and $35_2$ equal to that of the portion aligned with the portion $30_2$.

Figure 3G:
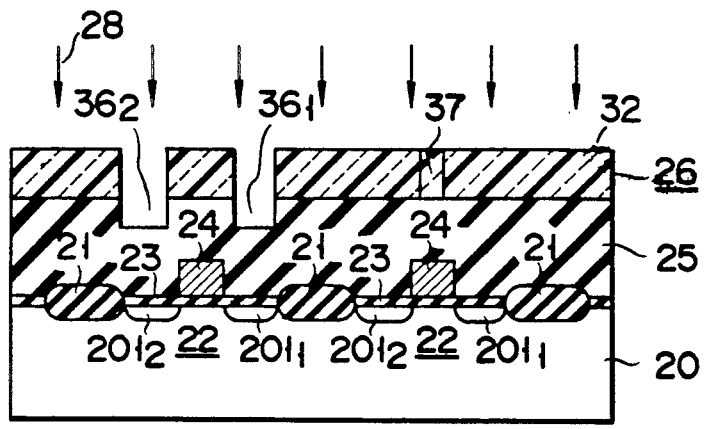

Subsequently, as is shown in FIG. 3G, ultraviolet light 28 is applied to the entire surface of the resist layer 26, thereby converting the portion $30_2$ into an alkali-soluble portion 37.

Figure 3H:
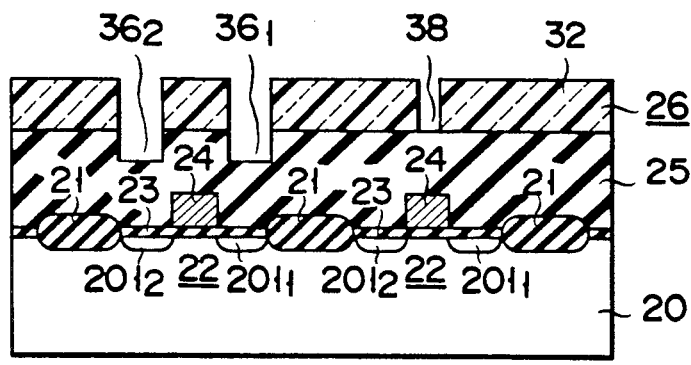
Figure 3I:
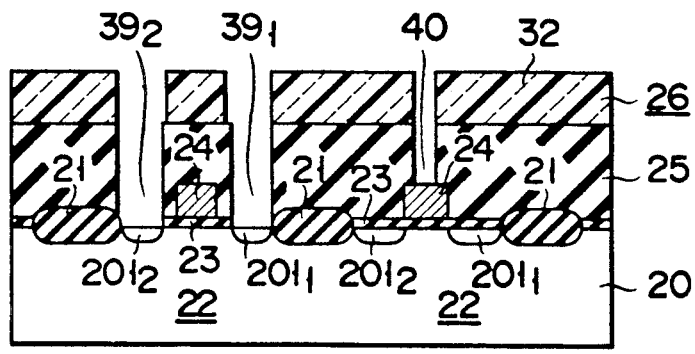

As is shown in FIG. 3H, an opening 38 is formed in the portion 37 by developing using choline solution Since, as shown in FIG. 3H, those portions of the layer 25 in which contact holes $39_1$ and $39_2$ (FIG. 3I) are to be formed for the impurity regions are as thick as that portion 40 (FIG. 3I) of the same in which a contact hole is to be formed for the gate electrode, these contact holes $39_1$, $39_2$ and 40 can be simultaneously formed, as shown in FIG. 3I, by means of a reactive ion etching (a dry process) or a wet etching without over-etching of the gate electrode.

Thereafter, as is shown in FIG. 3J, the resist layer 26 is removed from the resultant structure, which is the termination of the process of forming contact holes.

As is shown in FIG. 3K, a first wiring layer 41 is formed on the structure resulting from the processes shown in FIGS. 3A to 3J, thereafter forming a second interstage insulation layer 42 on the layer 41, and then forming a second positive-type resist layer 43 on the layer 42. Subsequently, the same processes as those shown in FIGS. 3A to 3J are repeated, thereby forming contact holes (not shown) in those portions of the interstage insulation layer 42 which have different thicknesses, without over-etching of the wiring layer 41.

Figure 1A:
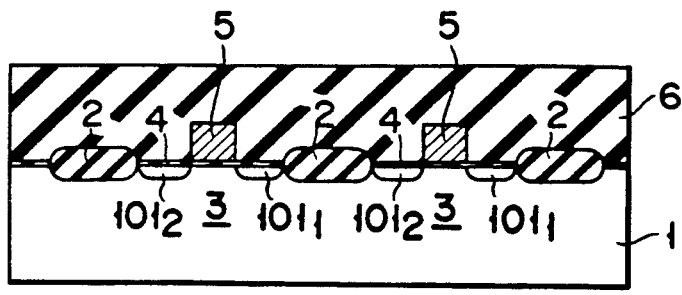
FIGS. 1A to 1E are sectional views, useful in explaining a conventional method of forming contact holes in a semiconductor device.
Figure 1B:
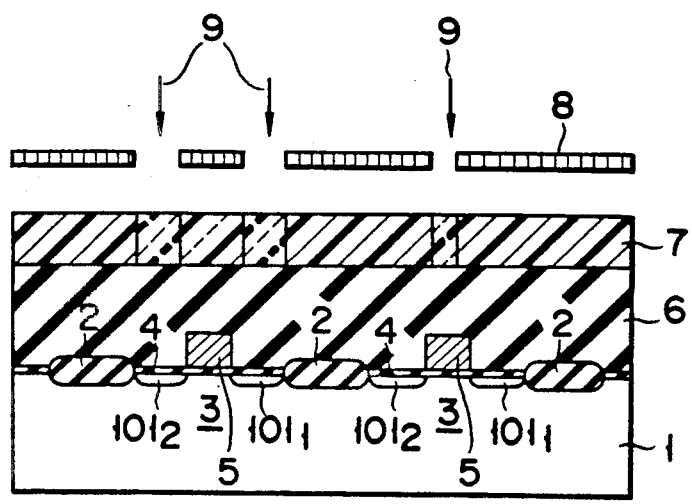
Figure 1C:
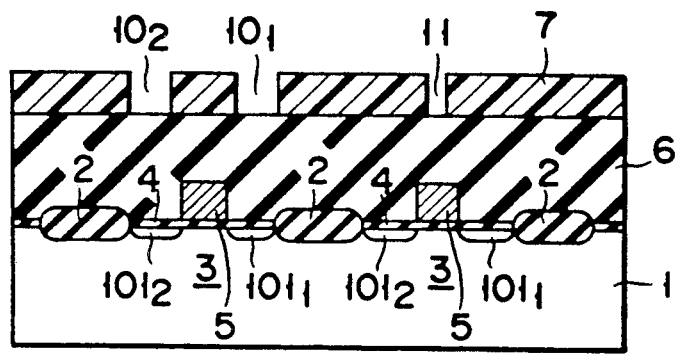
Figure 1D:
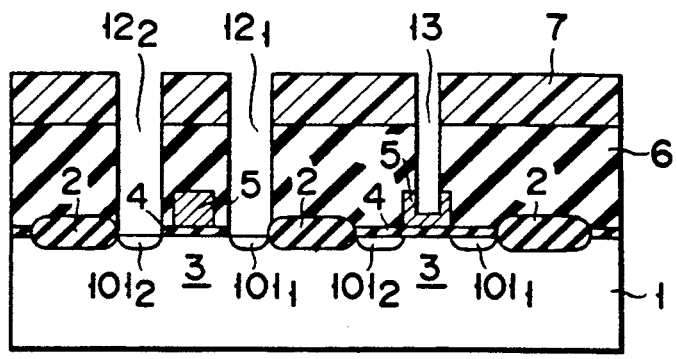
Figure 1E:
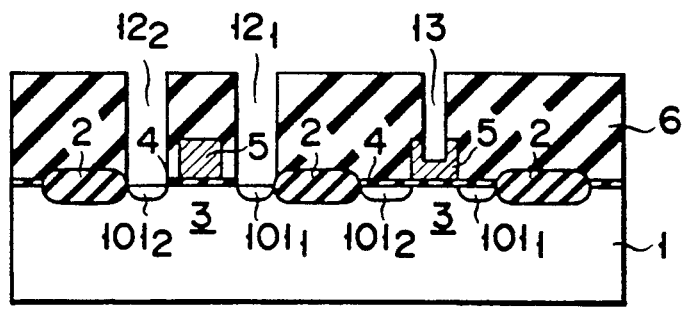
Figure 2:
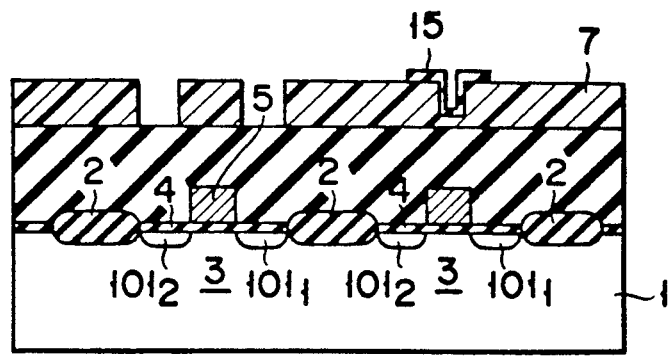
FIG. 2 is a sectional view, showing another conventional method.

In the conventional art, the gate electrode will be damaged by over-etching, as is shown in FIG. 1D. To avoid this, contact holes for gate electrodes must be formed by means of a process different from that in which contact holes for impurity regions are formed, which means an increase in the number of the required lithography processes and which reduces the accuracy of mask alignment. Also in other methods to avoid the above-described disadvantage, the number of the required lithography processes is large, and a process margin at the time of etching is small.

However, by virtue of the method of the present invention, a resist layer need only be formed one time, the contact holes for the gate electrode and impurity regions are formed in desired portions, and the gate electrode is formed as designed.

The present invention should not be limited to the above embodiment in which the invention is applied to a field effect transistor, and various modifications can be provided within the scope of the invention. That is, the present invention can be applied to embodiments in which contact holes are to be formed in those portions of an insulation layer which are different in thickness.

The semiconductor substrate can be of p-type and the impurity diffusion regions can be of n-type, though in the above embodiment the substrate is of n-type and the diffusion regions are of p-type.

In the above embodiment, that depth of the thick portion of the insulation layer 25 which is etched at the etching step shown in FIG. 3F is substantially the same as the thickness of the electrode 24. However, strictly, the above depth of the thick portion to be etched should be the sum of the electrode 24 and the thickness of the gate oxide layer 4. However, the thickness of the gate oxide layer 4 is significantly thinner than that of the electrode 24, and thus the thickness of the gate insulation layer 4 is negligible Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of forming contact holes comprising the steps of:

forming an element separating insulation layer of a predetermined pattern on a surface region of a semiconductor substrate of a first conductivity type to define an element-forming region in the semiconductor substrate;

forming an oxide layer on said element-forming region;

forming an electrode on said oxide layer;

forming an interstage insulation layer having a flat surface over the resultant semiconductor structure, the interstage insulation layer having a flat surface so that a portion of the interstage insulation layer which is on said semiconductor substrate is thicker than a portion of the interstage insulation layer which is on said electrode, the interstage insulation layer having a first portion in which a first contact hole leading to said semiconductor substrate is formed at a later step and a second portion in which a second contact hole leading to said electrode is formed at a later step;

forming a positive type photoresist layer over said interstage insulation layer, said positive type photoresist layer having a first portion corresponding to said first portion of said interstage insulation layer and a second portion corresponding to said second portion of said interstage insulation layer;

exposing a third portion of said photoresist layer which corresponds to a portion of said interstage insulation layer other than said first and second portions of said interstage insulation layer to light rays;

heating said photoresist layer to make said third portion of said photoresist layer insoluble to a developer;

exposing said first portion of said photoresist layer to light rays to make said first portion of said photoresist layer soluble;

subjecting said photoresist layer to a developer to dissolve said first portion of said photoresist layer to form a first opening;

etching said first portion of said interstage insulation layer to a predetermined thickness using the resultant photoresist layer as a mask, said predetermined thickness of the resultant first portion of the interstage insulation layer being substantially equal to a thickness of said second portion of the interstage insulation layer;

exposing said photoresist layer to light rays to make said second portion of the photoresist layer soluble;

subjecting said photoresist layer to a developer to dissolve said second portion of said photoresist layer to form a second opening; and simultaneously etching said resultant first portion and second portion of said interstage insulation layer using the resultant photoresist layer as a mask to form said first and second contact holes in said interstage insulation layer.

2. A method of forming contact holes according to claim 1, wherein said simultaneously etching step is performed by a reactive ion etching.

3. A method of forming contact holes according to claim 1, wherein said simultaneously etching step is performed by a wet etching.

4. A method of forming contact holes according to claim 1, wherein said heating step is performed in ammonia atmosphere.

5. A method of forming contact holes according to claim 1, wherein said first recited subjecting step is performed using choline as said developer.

6. A method of forming contact holes according to claim 1, wherein said second recited subjecting step is performed using an alkali solution as said developer.

7. A method of forming contact holes comprising the steps of:
forming an element separating insulation layer of a predetermined pattern on a surface region of a semiconductor substrate of a first conductivity type to define an element-forming region in the semiconductor substrate;
forming an oxide layer on said element-forming region;
forming an electrode on said oxide layer;
forming an interstage insulation layer having a flat surface over the resultant semiconductor structure, the interstage insulation layer having a flat surface so that a portion of the interstage insulation layer which is on said semiconductor substrate is thicker than a portion of the interstage insulation layer which is on said electrode, the interstage insulation layer having a first portion in which a first contact hole leading to said semiconductor substrate is formed at a later step and a second portion in which a second contact hole leading to said electrode is formed at a later step;
forming a positive type photoresist layer over said interstage insulation layer, said positive type photoresist layer having a first portion corresponding to said first portion of said interstage insulation layer and a second portion corresponding to said second portion of said interstage insulation layer;
exposing a third portion of said photoresist layer which corresponds to a portion of said interstage insulation layer other than said first and second portions of said interstage insulation layer to ultraviolet light rays;
heating said photoresist layer to make said third portion of said photoresist layer insoluble to a developer;
exposing said first portion of said photoresist layer to ultraviolet light rays to make said first portion of said photoresist layer soluble;
subjecting said photoresist layer to a developer to dissolve said first portion of said photoresist layer to form a first opening;
etching said first portion of said interstage insulation layer to a predetermined thickness using the resultant photoresist layer as a mask, said predetermined thickness of the resultant first portion of the interstage insulation layer being substantially equal to a thickness of said second portion of the interstage insulation layer;
exposing said photoresist layer to ultraviolet light rays to make said second portion of the photoresist layer soluble;
subjecting said photoresist layer to a developer to dissolve said second portion of said photoresist layer to form a second opening; and
simultaneously etching said resultant first portion and second portion of said interstage insulation layer using the resultant photoresist layer as a mask to form said first and second contact holes in said interstage insulation layer.

* * * * *